United States Patent [19]
Swiatowiec et al.

[11] 3,942,033
[45] Mar. 2, 1976

[54] CURRENT MODE LOGIC CIRCUIT

[75] Inventors: Frank J. Swiatowiec, Tempe; Ramachandra A. Rao, Scottsdale, both of Ariz.

[73] Assignee: Motorola, Inc., Chicago, Ill.

[22] Filed: May 2, 1974

[21] Appl. No.: 466,116

[52] U.S. Cl. ................. 307/215; 307/254; 307/310
[51] Int. Cl.² ........................................ H03K 17/00
[58] Field of Search ........... 307/215, 218, 254, 310; 330/30 D

[56] References Cited
UNITED STATES PATENTS

| | | | |
|---|---|---|---|
| 3,259,761 | 7/1966 | Narud et al. | 307/218 |
| 3,378,780 | 4/1968 | Lin | 330/30 D |
| 3,510,791 | 5/1970 | Nagata | 330/30 D |
| 3,638,131 | 1/1972 | Sarkissian | 330/30 D |

*Primary Examiner*—Stanley D. Miller, Jr.
*Assistant Examiner*—B. P. Davis
*Attorney, Agent, or Firm*—Harry M. Weiss; Kenneth R. Stevens

[57] ABSTRACT

A current mode logic circuit providing AND/OR type functions wherein "0" voltage level changes and spikes are substantially eliminated without sacrificing switching speeds by omitting conventional emitter and collector-dotting between the logic input gates and an emitter-follower output stage. The input gates employ diode loads for generating reduced signal swings for driving the output gate. The output gate contains more devices than a single emitter-follower output stage, but the reduced signal swing and a push-pull drive mode for the output gate offsets any increased switching times due to the greater number of devices and thus achieves the overall objectives without any overall sacrifice in switching speed.

6 Claims, 3 Drawing Figures

CURRENT MODE LOGIC CIRCUIT

BACKGROUND OF THE INVENTION

1. Field of the Invention

This invention relates to logic circuits and more particularly a current mode logic circuit.

2. Description of the Prior Art

In the past, input current mode logic gates normally drive emitter-follower output transistors. By way of example, the basic logic circuits are illustrated in U.S. Pat. No. 3,259,761, Narud et al., assigned to the same assignee as the present invention. In this logic implementation, the collector terminal of the reference switching transistor of one input gate is normally collector-dotted or directly connected to a like collector terminal of other reference transistors associated with additional input gates forming the overall logic block. This node is then connected to a single emitter-follower output transistor. For optimum results, the emitter terminal of a clamping transistor also is connected to this node, as is well known in the prior art. The clamping transistor attempts to maintain the collector-dot node at constant voltage level regardless of the number of input gates being switched to a conductive state.

In this collector-dot application even with the use of a clamping transistor, the generated down level of the emitter-follower output transistor experiences voltage level shifts for each additional input gate that is rendered to a conductive state. Transient spikes are generated during level shifts. Accordingly, the noise tolerance level of the overall logic circuit is deleteriously affected.

Similarly, in other logic applications, the collector terminals of the reference switching transistors associated with a logic input gate are each individually connected to an associated emitter-follower output transistor, and then the emitter terminals of each of the output emitter-follower output transistors are emitter-dotted or directly connected.

In the emitter-dotted environment, the total output current from an emitter-dotted logic block is a relatively fixed value. Thus with only one emitter-follower of the logic block in the conductive mode, the total output current is essentially supplied through one emitter-follower. When a second or additional emitter-follower is rendered conductive while the first emitter-follower is also conductive, then less current is supplied or required to be supplied by the initially conducting emitter-follower, as the other conducting emitter-followers contribute their proportional amount. These current transients generate a negative spike associated with the up level signal. Again, this reduces the noise tolerance levels of the overall logic block.

Moreover, the use of a clamping transistor in the collector-dot case causes additional temperature compensation problems as the emitter terminal of the emitter-follower output transistor resides at two base-to-emitter voltage drops, i.e., the base-to-emitter drop of a clamp transistor and that of the emitter-follower output transistor. Since temperature compensation tolerances are related to the number of individual base-to-emitter voltage drops, it can be seen that the additional base-to-emitter voltage drop of the clamping transistor renders the overall generated output voltage more susceptible to temperature changes.

SUMMARY OF THE INVENTION

It is therefore an object of the present invention to provide a current mode logic circuit capable of furnishing AND/OR - AND/OR/INVERT functions which substantially eliminates level shifts and spikes in the generated output voltages without sacrificing switching speed.

A further object of the present invention is to provide a current mode logic circuit which increases the switching speed of the output gate by switching with signals residing in opposite states.

Another object of the present invention is to provide a current mode logic circuit which requires reduced signal swings to drive the output gate.

A further object of the present invention is to provide a current mode logic circuit wherein emitter-follower circuits normally employed to connect the input stage or input gate to the output stage are eliminated.

Another object of the present invention is to provide a current mode logic which eliminates a clamping transistor in the collector-dotted mode thus improving its insensitivity to temperature variations.

Another object of the present invention is to provide a current mode logic circuit wherein output gate provides improved discharge paths due to the elimination of the emitter-follower stage interconnecting input and output logic gates.

In accordance with the aforementioned objects, the present invention provides a current mode logic circuit wherein the resistor load devices of the input logic gates are replaced by diode loads for reducing signal swings generated from the input gate switching and reference transistors, and the output gate includes a single reference transistor collector-dotted to respective reference transistors associated with the input gates, and M switching transistors corresponding to M input gates and which output gate is selectively responsive to generated signals of opposite states for switching output states. Also, the diodes provide an additional advantage, in that they track upwardly with increasing temperature variations and thus improve performance by helping to limit or prevent saturation of the input transistors.

BRIEF DESCRIPTION OF THE PREFERRED EMBODIMENTS

Figure 1:
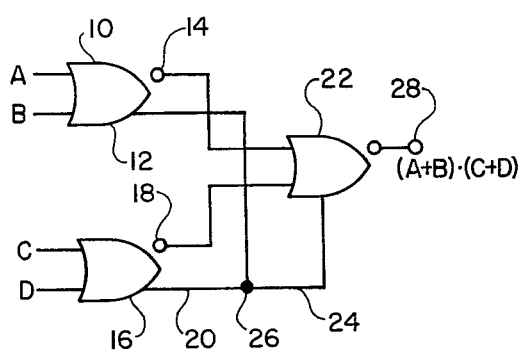
FIG. 1 is a schematic block diagram illustrating the functional and logic characteristics of the present invention.
Figure 2:
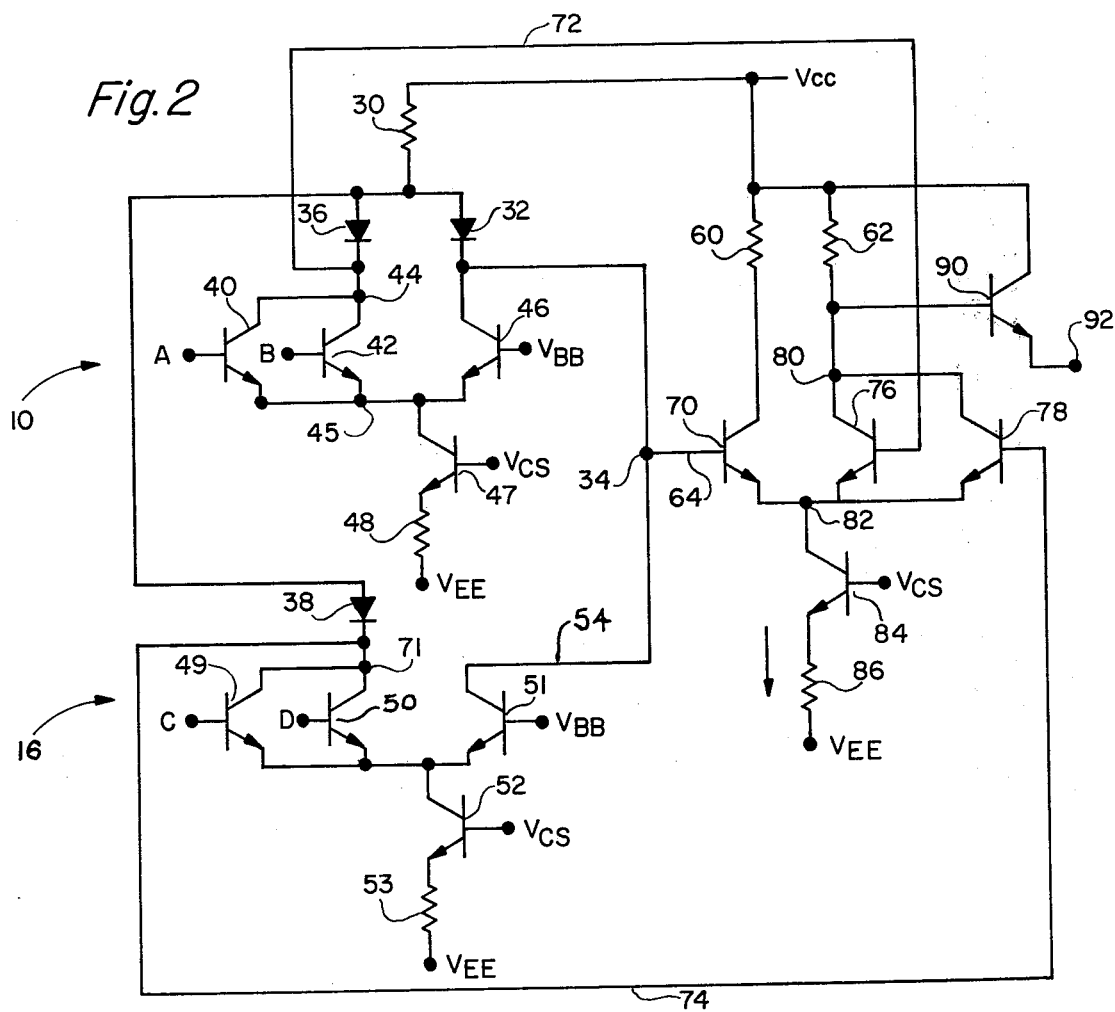
FIG. 2 is a specific schematic diagram illustrating the detailed elements associated with the block diagram of FIG. 1.

Now referring to FIGS. 1 and 2, they illustrate a two input gate logic circuit of the present invention. An upper input gate 10 is responsive to logic signals A and B for generating an in-phase logic signal at output line 12 and an out-of-phase logic signal at output line 14. Similarly, input gate 16 is responsive to logic input signals C and D for generating an out-of-phase output signal on output line 18 and an in-phase output signal on output line 20. An output gate 22 is connected at its inputs terminals to lines 14 and 18. An additional control signal or logic signal is supplied to output gate 22 by means of line 24 which is connected to node 26, and constitutes a collector-dot connection between lines 12 and 20.

Logically, the input gates 10 and 16 constitute NOR-/OR gates while the output gate 22 can be viewed as a NAND gate with input line 24 supplying an enable or control signal thereto for generating the logic function as designated at output terminal 28.

FIG. 2 illustrates a specific circuit schematic for the functional diagram shown in FIG. 1, and wherein like reference numerals are employed to designate like elements. The pair of input gates 10 and 16 are connected to the indicated supply voltages, and in the preferred embodiment the values of these voltages are as follows:

$V_{CC}$ = ground potential
$V_{EE}$ = −5.2 volts
$V_{BB}$ = −1.3 volts
$V_{CS}$ = −3.5 volts The voltage supply $V_{CC}$ in combination with resistor 30 functions as a relatively constant current source for delivering approximately 6 milliamps of current, when the inputs are low, to a diode load 32 connected at its anode to the bottom of resistor 30 and at its cathode to each of the input gates at node 34. The other portion of the load connected to resistor 30 is constituted by a plurality of individual diodes 36 and 38 associated with each of the input gates. The input logic signals A and B are supplied to the base terminals of a pair of input switching transistors 40 and 42 having their collectors commonly connected at node 44 and their emitters commonly connected at node 45. Also associated with each of the input gates is a reference transistor 46 having its base terminal connected to a constant reference voltage supply $V_{BB}$, its collector terminal connected to node 34, and its emitter terminal connected to node 45. A current source constituted by transistor 47 having its base terminal connected to negative supply $V_{CS}$, its collector terminal connected to node 45, and its emitter terminal connected to the voltage source $V_{EE}$ by means of resistor 48.

Input gate 16 is substantially identical to gate 12 and is adaptive to receive logic input signals C and D at its respective logic input switching transistors. Respectively, elements 49, 50, 51, 52, and 53 correspond to elements 40, 42, 46, 47, and 48. The collector of reference switching transistor 51 is connected to the cathode terminal of diode 32 by means of line 54 at node 34. Naturally if additional input gates are employed in the overall logic block the collector terminal of the reference switching transistors associated with each input gate are similarly connected to node 34.

The output gate 22 comprises a pair of load resistors 60 and 62 connected to the supply $V_{CC}$. The input line to the output gate 16 is constituted by line 64 connected to node 34. Again, node 34 constitutes a collector-dot or direct connection between the respective collector terminals of the constant reference switching transistors associated with the input gates. This collector-dot signal is applied to an input reference switching transistor 70 having its collector terminal connected to the bottom terminal of resistor 60. Out-of-phase signals generated from the respective input gates at node 44 associated with the upper input gate 10 and at a node 71 associated with the bottom input gate 16 are applied by way of lines 72 and 74, respectively, to the base terminals of output gate switching transistors 76 and 78. The collector terminals of transistors 76 and 78 are connected at a common node 80 at the bottom of resistor 62. The emitters of transistors 70, 76, and 78 are connected at a common node 82 to a current source constituted by transistor 84, resistor 86, and supply voltage $V_{CS}$ and $V_{EE}$. The output signal for the circuit is supplied to an emitter-follower output transistor 90 whose base-to-collector terminals are connected across resistor 62 and whose emitter terminal is connected to the output terminal 92.

Figure 3:
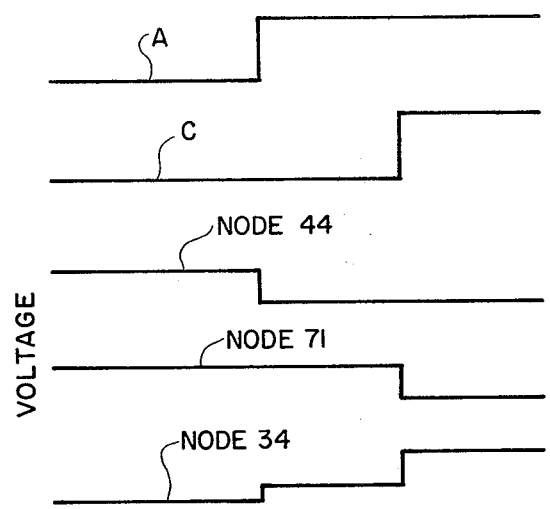
FIG. 3 illustrates waveforms generated at various points in the circuit of FIG. 2 for purposes of operational explanation.

Now referring to FIGS. 2 and 3, they illustrate the operation of the present invention. For purposes of simplicity it is assumed that logic signals B and D remain at a low state during the operational description. In the preferred embodiment, the high state is represented by approximately −0.875 volts and the low state by approximately −1.75 volts. At time t1 both the A and the C input signals are at a relatively down level and thus all the logic input switching transistors connected to logic signals A, B, C, and D are off and thus the reference switching transistors 46 and 51 associated with the input gates are on. With both transistors 46 and 51 in an on condition then the 6 milliamps of current flows through resistor 30 and is shared equally by the two input gates, i.e., three milliamps per gate, and accordingly, node 34 is at a low condition as both collector terminals of transistors 46 and 51 are at a relatively low state. Similarly, with the input switching transistors in a non-conductive state nodes 44 and 71 are at a relatively high state and thus transistors 76 and 78 are conductive due to the application of these up levels on lines 72 and 74, respectively. Thus, node 80 is at a relatively down level and this down level is applied to output terminal 92 by means of emitter-follower transistor 90.

At time t2 logic signal A goes to an up level and logic signals B, C, and D remain at a down or low level and thus transistor 40 is rendered conductive and transistors 49 and 50 remain non-conductive. Node 44 goes to a low level and node 71 remains at a high level. With transistor 40 in a conductive state, transistor 46 is rendered non-conductive thus switching a 3 milliamp flow of current through diode 36. Since transistor 51 is still in a conductive state or on, 3 milliamps continues to flow through load or diode 32, and node 34 remains low. As the current flow through diode 32 is decreased from 6 milliamps to 3 milliamps, a slight voltage rise of approximately 30 millivolts is experienced at node 34, as represented by the slight voltage step at time $t2$ but yet the node is still at a relatively low level from a logic standpoint. Thus, transistors 70 and 76 are non-conductive while transistor 78 is conductive by virtue of the high signal applied via line 74. Accordingly, current flow through transistor 78 causes a voltage drop across resistor 62 and maintains output terminal 92 at a low or down level.

At time $t3$, logic signal A remains high and logic C also is switched up state. Signals B and D can either be high or low and the same results are obtained, node 44 remains low as transistor 40 is still on or in a conductive state.

Similarly, node 71 goes to a low state at time $t3$ as transistor 49 is rendered conductive and transistor 51 non-conductive. With both transistors 46 and 51 in a non-conductive or off state only base current flows through diode load 32 and therefore, node 34 is switched to a high state rendering transistor 70 conductive. The low levels at nodes 44 and 71 maintain transistors 76 and 78 non-conductive and thus current flow is switched through resistor 60 instead of 62. Without current flow through resistor 62 no voltage drop exists, only a negligible base induced voltage drop, and thus the emitter terminal of transistor 90 essentially goes to ground potential so as to switch output terminal to a high state.

It is noted that in the operation of this circuit a constant current flow, 6 milliamps in the preferred embodiment, is always flowing through resistor 30 which maintains node 34 at relatively low levels in order to avoid saturating transistor 70 thus insuring fast switching speeds.

The circuit described herein is only illustrated as consisting of two input gates; however, it is to be realized that additional input gates can be readily added to satisfy logic requirements.

While the invention has been particularly shown and described in reference to the preferred embodiments thereof, it will be understood by those skilled in the art that changes in form and details may be made therein without departing from the spirit and scope of the invention.

What is claimed is:

1. A non-saturating logic circuit comprising:
    a. an M number of current mode input gates, each current mode input gate including a group of common collector node input logic switching transistors, and an interconnected reference voltage switching transistor;
    b. a first node logic connection, the reference voltage switching transistor associated with each of the M input gates being collector dotted to the first node logic connection;
    c. a current mode output gate, the output gate including an input switching transistor coupled to the first node logic connection and M interconnected selectively enabled reference transistors;
    d. a first load diode coupled to a reference voltage source means and to the first node logic connection for establishing a logic level signal swing at the input switching transistor of the output gate in response to the application of input logic signals to the input gates;
    e. each of the M reference transistors of the output gate being coupled, respectively, to one of the group of common collector node input logic switching transistors so as to be selectively enabled; and
    f. the output gate being responsive to a logic level signal swing at the first node logic connection and to the selective enabling of the M reference transistors for generating an output logic level signal.

2. A non-saturating logic circuit as in claim 1 further including:
    a. M conductive means for respectively connecting the base terminal of each of the M reference transistors of the output gate to a common collector node associated with the respective input gates for driving the output gate in a push-pull mode.

3. A non-saturating logic circuit as in claim 1 further comprising:
    a. M second nodes being constituted by the total number of common collector nodes for the M input gates;
    b. each of the M reference transistors of the output gate being respectively connected to one of the second nodes; and
    c. M second load diodes, each respectively coupled between one of the second nodes and the reference voltage source means.

4. A non-saturating logic circuit as in claim 3 further including:
    a. current source means coupled to the M input gates and the output gate for providing a plurality of current sources, each current source supplying a predetermined valued current flow to the M input gates and the output gate, respectively.

5. A non-saturating logic circuit as in claim 4 wherein:
    a. each of the input gates comprise an OR type logic gate; and
    b. the first node logic connection and the output gate comprise an AND type logic gate.

6. A non-saturating logic circuit as in claim 5 wherein:
    a. the output gate further includes an emitter follower transistor coupled to the collector terminal of the selectively enabled reference transistor of the output gate for supplying the output logic level signal at its emitter terminal.

* * * * *